(12) United States Patent
Lee et al.

(10) Patent No.: US 10,781,096 B2
(45) Date of Patent: Sep. 22, 2020

(54) MEMS DEVICE

(71) Applicant: Samsung Electro-Mechanics Co., Ltd., Suwon-si (KR)

(72) Inventors: Tae Hun Lee, Suwon-si (KR); Kwang Su Kim, Suwon-si (KR); Tae Yoon Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/357,588

(22) Filed: Mar. 19, 2019

(65) Prior Publication Data

US 2020/0087141 A1 Mar. 19, 2020

(30) Foreign Application Priority Data

Sep. 18, 2018 (KR) .................. 10-2018-0111289

(51) Int. Cl.
  *B81B 7/00* (2006.01)
  *B81B 7/02* (2006.01)
  *B81C 1/00* (2006.01)

(52) U.S. Cl.
  CPC .............. *B81B 7/0077* (2013.01); *B81B 7/02* (2013.01); *B81C 1/00269* (2013.01); *B81B 2203/033* (2013.01); *B81B 2203/0315* (2013.01); *B81C 2203/0109* (2013.01)

(58) Field of Classification Search
  CPC . H01L 2924/16152; H01L 2924/16151; H01L 2924/1616; H01L 2924/16196; H01L 2924/16235; H01L 23/04; H01L 23/041; H01L 23/02; B81B 7/0032; B81B 7/0077; B81B 2203/033; B81B 2203/0109; B81B 2203/0315; B81C 1/00277; B81C 1/00269
  See application file for complete search history.

(56) References Cited

U.S. PATENT DOCUMENTS

2002/0150129 A1* 10/2002 Coldren .............. H01S 5/18305
372/20
2017/0179919 A1  6/2017 Yang et al.

FOREIGN PATENT DOCUMENTS

JP  2003-53775 A  2/2003
JP  2003-43312 A  2/2013
KR  10-2017-0073080 A  6/2017

* cited by examiner

*Primary Examiner* — Hsien Ming Lee
(74) *Attorney, Agent, or Firm* — NSIP Law (57) ABSTRACT

A MEMS device includes a substrate, a MEMS element portion disposed on a surface of the substrate, a cap having a cavity formed to oppose the MEMS element portion, and a diffusion prevention layer formed on at least a portion of the cap, wherein at least one of the cap and the substrate includes a bonding layer disposed outside of the cavity, and wherein the cap includes a spreading prevention portion disposed between the bonding layer and the cavity and having a V-shape in cross-section.

16 Claims, 6 Drawing Sheets

MEMS DEVICE

CROSS-REFERENCE TO RELATED APPLICATION

This application claims the benefit under 35 USC 119(a) of Korean Patent Application No. 10-2018-0111289 filed on Sep. 18, 2018, in the Korean Intellectual Property Office, the entire disclosure of which is incorporated herein by reference for all purposes.

BACKGROUND

1. Field

This application relates to a Micro-Electro-Mechanical Systems (MEMS) device.

2. Description of the Background

A metal bonding technique is typically used for a hermetic seal in the fabrication of MEMS devices, for example, MEMS devices that require wafer level bonding.

However, there is a problem that spreading of a bonding material, such as a solder, may cause breakage of the hermetic seal and the occurrence of defects. In detail, the bonding material may flow into a spreading prevention structure made to prevent the bonding material from spreading into a cavity, and may diffuse therein by interacting with a silicon substrate to break the hermetic seal.

Therefore, it is necessary to develop a structure which can prevent a hermetic seal from being broken and becoming defective.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a MEMS device includes a substrate, a MEMS element portion disposed on a surface of the substrate, a cap having a cavity formed to oppose the MEMS element portion, and a diffusion prevention layer formed on at least a portion of the cap, wherein at least one of the cap and the substrate includes a bonding layer disposed outside of the cavity, and wherein the cap includes a spreading prevention portion disposed between the bonding layer and the cavity and having a V-shape in cross-section.

The diffusion prevention layer may be formed at least within the spreading prevention portion and around the bonding layer.

The cap may be formed of a material containing silicon, and the bonding layer may be formed of a metal material.

The bonding layer may be formed of a material containing at least one of gold (Au), tin (Sn), chromium (Cr), titanium (Ti), and aluminum (Al).

The diffusion prevention layer may be formed of an oxide film.

The spreading prevention portion may have an inclined surface having an angle of 50° to 60° by a crystal plane (111).

The spreading prevention portion may have an inclined surface having an angle of about 54.74° by a crystal plane (111).

The cavity may be exposed through the diffusion prevention layer.

The spreading prevention portion may have a strip shape corresponding to a shape of the cavity.

The cavity may have a rectangular shape in cross-section.

A portion of the bonding layer may be extended into the spreading prevention portion.

In another general aspect, a MEMS device includes a cap having a cavity and a spreading prevention trench disposed outward of the cavity, wherein the spreading prevention trench includes opposing inclined walls in cross-section, a diffusion prevention layer disposed on the cap and in the spreading prevention trench, a bonding layer disposed on the diffusion prevention layer outward of the cavity, a substrate disposed on the bonding layer, and a MEMS element portion disposed on the substrate between the substrate and the cavity.

The diffusion prevention layer may be disposed in the cavity.

The bonding layer may be disposed outward of the spreading prevention trench.

The bonding layer may extend into the spreading prevention trench.

The spreading prevention trench may have a V-shape in cross-section.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. Hereinafter, while embodiments of the present disclosure will be described in detail with reference to the accompanying drawings, it is noted that examples are not limited to the same.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Herein, it is noted that use of the term "may" with respect to an example, for example, as to what an example may include or implement, means that at least one example exists in which such a feature is included or implemented while all examples are not limited thereto.

An aspect of the present disclosure is to provide a MEMS device capable of preventing the occurrence of defects due to breaking of a hermetic seal.

Figure 1:
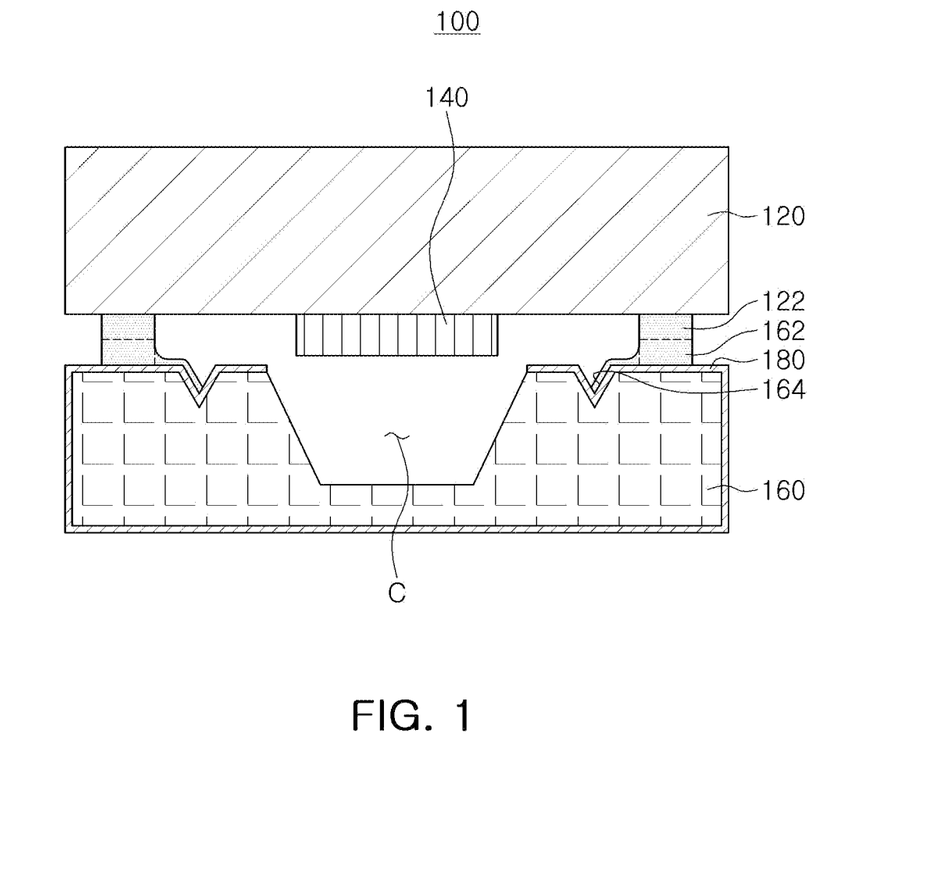
FIG. 1 is a schematic cross-sectional view illustrating a MEMS device according to one or more embodiments of the present disclosure.
Figure 2:
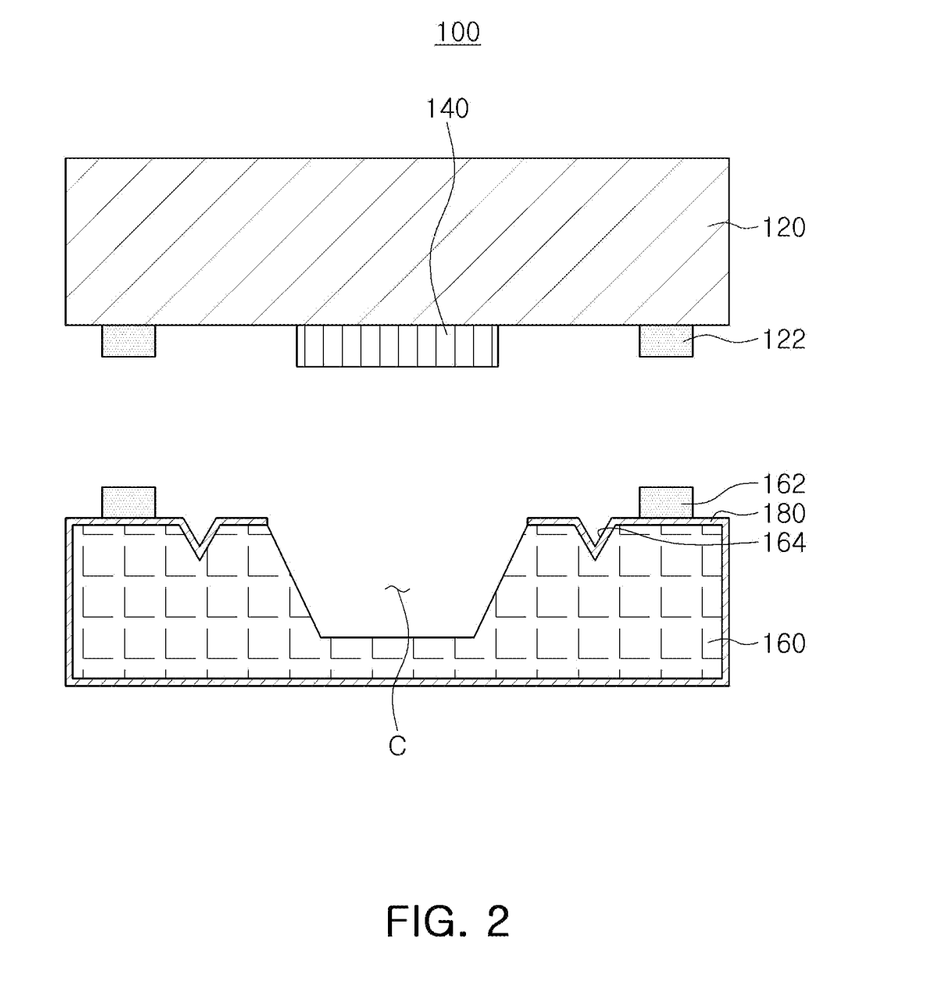
FIG. 2 is an exploded cross-sectional view illustrating a MEMS device according to one or more embodiments of the present disclosure.

FIG. 1 is a schematic cross-sectional view illustrating a MEMS device according to one or more embodiments of the present disclosure, and FIG. 2 is an exploded cross-sectional view illustrating a MEMS device according to one or more embodiments of the present disclosure.

Referring to FIGS. 1 and 2, a MEMS device 100 may include a substrate 120, a MEMS element portion 140, a cap 160, and a diffusion prevention layer 180.

The substrate 120 may be a silicon substrate. For example, as the substrate 120, a silicon wafer may be used, or a silicon on insulator (SOI) type substrate may be used. Meanwhile, a first bonding layer 122 corresponding to a second bonding layer 162 of the cap 160 to be described later, may be provided at an edge of the substrate 120. The first bonding layer 122 may be disposed to surround the MEMS element portion 140.

Meanwhile, the first bonding layer 122 may be bonded to the second bonding layer 162 of the cap 160 to be described later. The first bonding layer 122 and the second bonding layer 162 may constitute a bonding layer. As an example, the first bonding layer 122 may be formed of a material containing at least one of gold (Au), tin (Sn), chromium (Cr), titanium (Ti), and aluminum (Al).

The MEMS element portion 140 may be formed on one surface of the substrate 120. As an example, the MEMS element portion 140 may be formed on a lower surface of the substrate 120. Meanwhile, the MEMS element portion 140 may be disposed in an area in an inward direction from the first bonding layer 122 of the substrate 120, and, in particular, may be disposed in an upper portion of a cavity C of the cap 160 to be described later. The MEMS element portion 140 may be, for example, a bulk-acoustic wave (BAW) resonator, a surface-acoustic wave (SAW) resonator, an acceleration sensor, an angular velocity sensor, or the like.

The cap 160 may include a cavity C disposed to be opposite to the MEMS element portion 140, and may include a second bonding layer 162 disposed outside of the cavity C. The cap 160 may be formed with a spreading prevention portion 164 disposed between the second bonding layer 162 and the cavity C and having a V-shape in cross-section. The spreading prevention portion 164 may be formed with a groove. By forming the spreading prevention portion 164 having the 'V' shape, the bonding layer (e.g., the second bonding layer 162) and the cavity C may be formed in the subsequent processes, without difficulty in the process due to a difference in a stepped shape.

Meanwhile, in an example, the cap 160 may be formed of a material containing silicon (Si). The spreading prevention portion 164 may be formed by performing a wet etching process on the cap 160 with an anisotropic etching solution such as tetramethyl ammonium hydroxide (TMAH) ($N(CH_3)_4OH$). In this case, the spreading prevention portion 164 may be formed to have an inclination angle of about 54.74° by a crystal plane (111), due to the crystallinity of silicon (Si). The inclination angle may be formed to be within a range of 50° to 60°.

The second bonding layer 162 may seal an area in a central direction from the second bonding layer 162 and the first bonding layer 122, together with the first bonding layer 122, and may serve to bond the substrate 120 and the cap 160. The second bonding layer 162 may be formed of a material containing at least one of gold (Au), tin (Sn), chrome (Cr), titanium (Ti), and aluminum (Al).

Meanwhile, the second bonding layer 162 and the first bonding layer 122 may be bonded to each other by, for example, a solid liquid inter-diffusion (SLID) bonding process, a metal bonding process, or the like. As described above, when the second bonding layer 162 and the first bonding layer 122 are bonded, the spreading prevention portion 164 may serve to accommodate the second bonding layer 162 and the first bonding layer 122, and may prevent the second bonding layer 162 and the first bonding layer 122 from flowing into the cavity C.

In addition, the cavity C of the cap 160 may have a rectangular cross-section, for example, a trapezoidal shape.

The diffusion prevention layer 180 may be formed in at least a portion of the cap 160. As an embodiment, the diffusion prevention layer 180 may be formed on the entire outer surface of the cap 160, except an inner portion of the cavity C of the cap 160. The diffusion prevention layer 180 may prevent the second bonding layer 162 and the first bonding layer 122 from diffusing toward the silicon of the cap 160 to break a hermetic seal.

As an example, the diffusion prevention layer 180 may be formed of an oxide film. Meanwhile, since the diffusion prevention layer 180 may be formed in the spreading prevention portion 164, the second bonding layer 162 and the first bonding layer 122 introduced into the spreading prevention portion 164 may prevent occurrence of peeling in a bonding interface, and may also spread toward the Si side of the cap 160.

For example, since the diffusion prevention layer 180 may be formed in a peripheral region of the bonding layer 162 without a non-stacked region, the second bonding layer 162 and the first bonding layer 122 may prevent spreading toward the Si side of the cap 160. As a result, a hermetic seal may be prevented from being broken.

For example, when the non-stacked region of the diffusion prevention layer 180 is generated, the second bonding layer 162 and the first bonding layer 122 may be diffused to the silicon (Si) side contained in the cap 160, in a region in which the diffusion prevention layer 180 is not formed. Therefore, peeling may occur at the bonding interface, a hermetic seal may be broken, and defects may be generated. Since the cross-section of the spreading prevention portion 164 has a 'V' shape, a non-stacked region of the diffusion prevention layer 180 may be generated in an inner surface of the spreading prevention portion 164 and in a peripheral region of the second bonding layer 162. As a result, the hermetic seal may be prevented from being broken.

When the second bonding layer 162 and the first bonding layer 122 are bonded to each other through the spreading prevention portion 164, it is possible to prevent the second bonding layer 162 and the first bonding layer 122 from flowing to the cavity C.

Since the cross-section of the spreading prevention portion 164 has a 'V' shape, the diffusion prevention layer 180 may be formed on the inner surface of the spreading prevention portion 164 and around the second bonding layer 162 without a non-stacked region. Therefore, the diffusion of the second bonding layer 162 and the first bonding layer 122 toward the silicon (Si) contained in the cap 160 may occur to prevent peeling off from the bonding interface. Therefore, it is possible to prevent the hermetic seal from being broken, and the occurrence of defects may finally be prevented.

FIGS. 3 to 7 are schematic cross-sectional views illustrating an example method of manufacturing a cap included in a MEMS device according to one or more embodiments of the present disclosure.

FIGS. 3 to 7 are will be referred to for explaining an example method of manufacturing a cap included in the MEMS device according to the one or more embodiments of the present disclosure.

Figure 3:
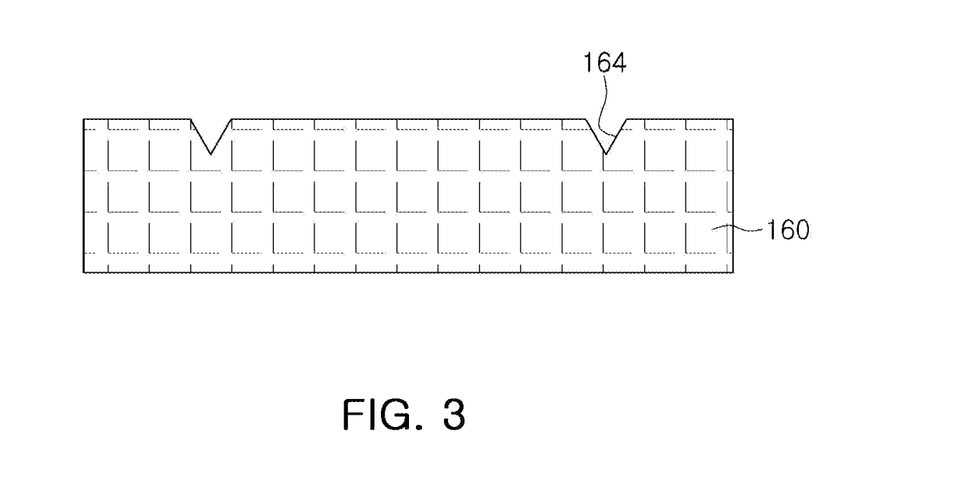
FIGS. 3 to 7 are schematic cross-sectional views illustrating an example method of manufacturing a cap included in a MEMS device according to one or more embodiments of the present disclosure.

First, as illustrated in FIG. 3, the spreading prevention portion 164 may be formed in the cap 160. The spreading prevention portion 164 may be formed by performing a wet etching process on the cap 160 with an anisotropic etching solution such as tetramethyl ammonium hydroxide (TMAH) ($N(CH_3)_4OH$). In this case, the spreading prevention portion 164 may be formed to have an inclination angle of about 54.74° by a crystal plane (111), due to the crystallinity of silicon (Si). In another example, when the cap is formed of another material, such as SiGe, and the like, the spreading prevention portion 164 may be formed to have an inclination angle dependent on a crystal plane (111), due to the crystallinity of this other material. For example, the cross-section of the spreading prevention portion 164 may have a 'V' shape.

Figure 4:
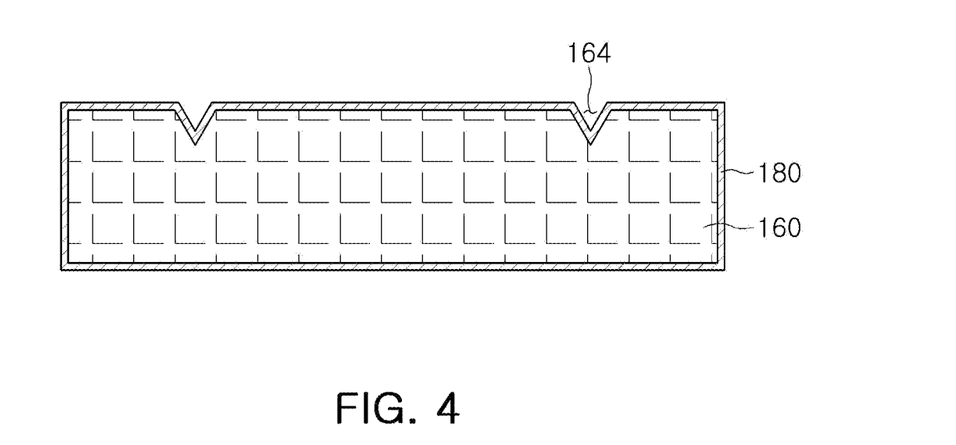

Then, as illustrated in FIG. 4, a diffusion prevention layer 180 may be formed on an outer surface of the cap 160. The diffusion prevention layer 180 may be formed on the outer surface of the cap 160 by a thermal oxidation process. Therefore, the diffusion prevention layer 180 may be also formed in the spreading prevention portion 164. Since the cross-section of the spreading prevention portion 164 has a V shape, the diffusion prevention layer 180 may be formed in the spreading prevention portion 164 without a non-stacked region.

Figure 5:
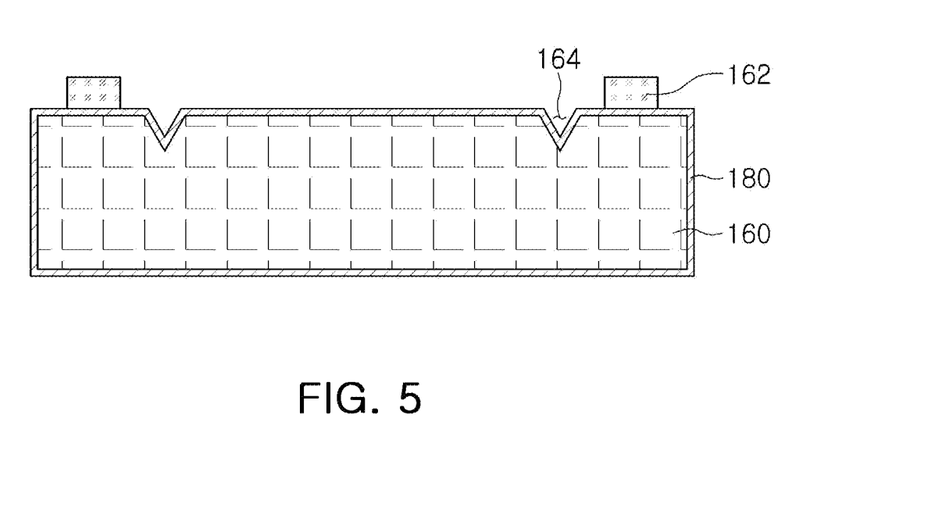

Then, as illustrated in FIG. 5, a second bonding layer 162 may be formed on the upper surface of the cap 160. The second bonding layer 162 may be disposed outside the spreading prevention portion 164. The second bonding layer 162 may be disposed to surround the spreading prevention portion 164. For example, the second bonding layer 162 may be formed of a material containing at least one of gold (Au), tin (Sn), chromium (Cr), titanium (Ti), aluminum (Al), copper (Cu), and Germanium (Ge).

Figure 6:
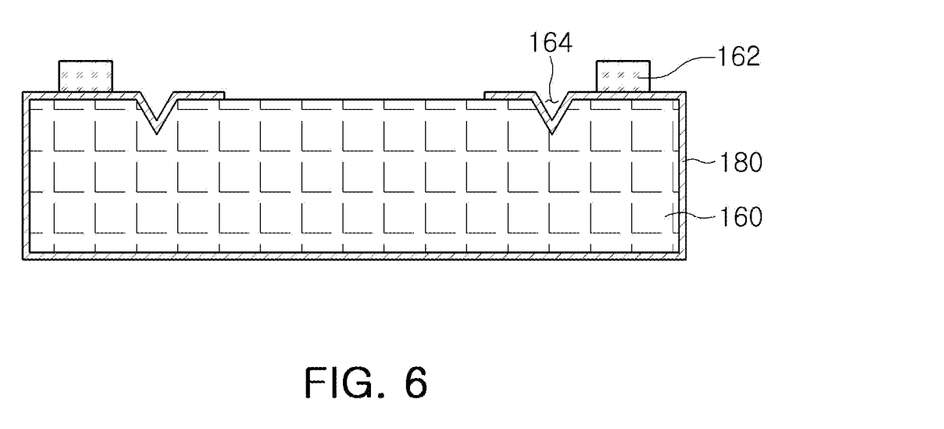

Thereafter, as illustrated in FIG. 6, a portion of the diffusion prevention layer 180 may be removed. At this time, the diffusion prevention layer 180 may be removed by patterning.

Figure 7:
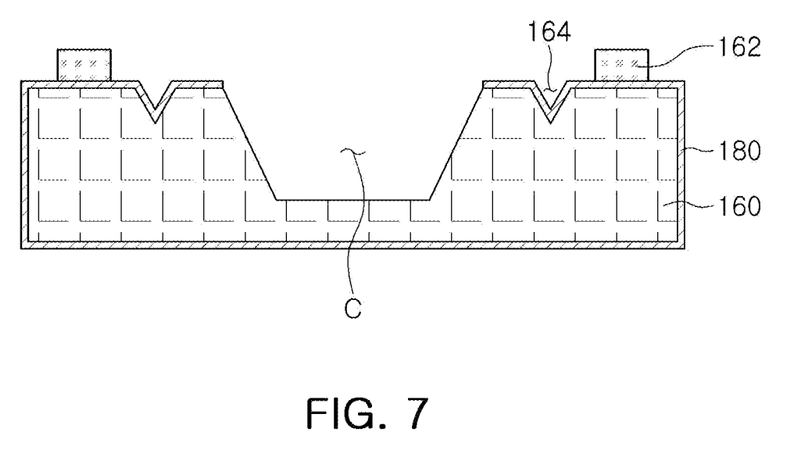

Thereafter, as illustrated in FIG. 7, a cavity C may be formed in the cap 160 by etching. The cavity C may be formed in a dry etching process or wet etching process, and may be formed to be disposed inside the spreading prevention portion 164. For example, the cavity C may have a rectangular shape, for example, a trapezoidal shape in cross-section.

As described above, the diffusion prevention layer 180 may be formed on the upper surface of the cap 160, except for the cavity C, without a non-stacked region. In addition, since the diffusion prevention layer 180 may be formed through a simple process, manufacturing costs may be reduced and the manufacturing yield may be improved.

Figure 8:
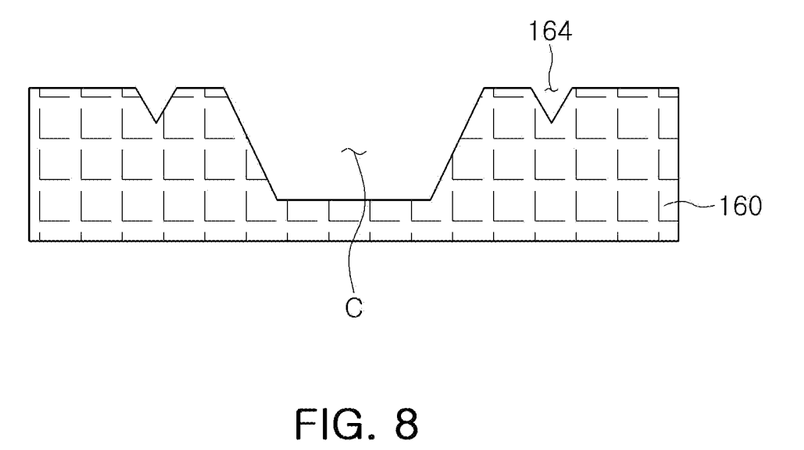
FIGS. 8 to 10 are schematic cross-sectional views illustrating another example method of manufacturing a cap included in a MEMS device according to one or more embodiments of the present disclosure.
Figure 9:
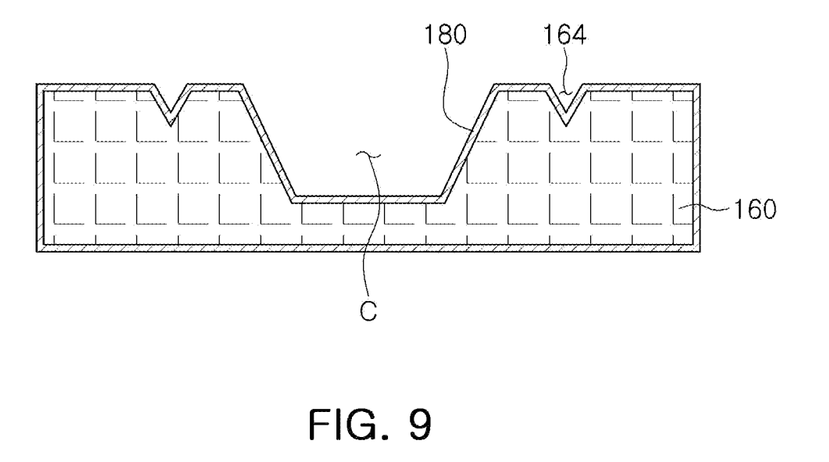
Figure 10:
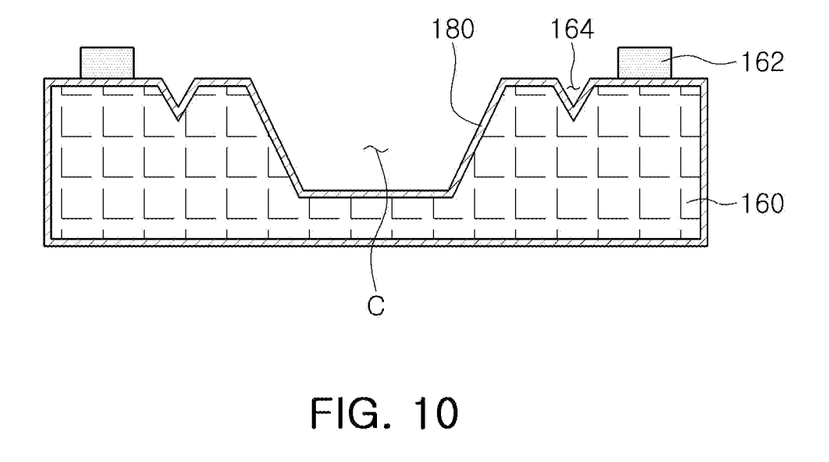

FIGS. 8 to 10 are schematic cross-sectional views illustrating another example method of manufacturing a cap included in a MEMS device according to one or more embodiments of the present disclosure.

As illustrated in FIG. 8, a cavity C and a spreading prevention portion 164 may be formed in the cap 160. The cavity C and the spreading prevention portion 164 may be formed by performing a wet etching process on the cap 160 with an anisotropic etching solution such as tetramethyl ammonium hydroxide (TMAH) ($N(CH_3)_4OH$). In this case, the cavity C and the spreading prevention portion 164 may be formed to have an inclination angle of about 54.74° by a crystal plane (111), due to the crystallinity of silicon (Si). For example, the cavity C may have a rectangular shape, for example, a trapezoidal shape in cross-section, and the spreading prevention portion 164 may have a 'V' shape in cross-section.

Then, as illustrated in FIG. 9, a diffusion prevention layer 180 may be formed on the outer surface of the cap 160. The diffusion prevention layer 180 may be formed on the outer surface of the cap 160 by a thermal oxidation process. Therefore, the diffusion prevention layer 180 may be also formed in the cavity C and the spreading prevention portion 164. Since the spreading prevention portion 164 has a V shape in cross-section, the diffusion prevention layer 180 may be formed in the spreading prevention portion 164 without a non-stacked region.

Thereafter, as illustrated in FIG. 10, a second bonding layer 162 may be formed on the upper surface of the cap 160. The second bonding layer 162 may be disposed outside the spreading prevention portion 164. The second bonding layer 162 may be disposed to surround the spreading prevention portion 164. For example, the second bonding layer 162 may be formed of a material containing at least one of gold (Au), tin (Sn), chromium (Cr), titanium (Ti), and aluminum (Al).

As described above, the diffusion prevention layer 180 may be formed on the upper surface of the cap 160 without a non-stacked region. In addition, since the diffusion prevention layer 180 may be formed through a simple process, manufacturing costs may be reduced and the manufacturing yield may be improved.

According to an aspect of the present disclosure, there may be an effect that the occurrence of defects due to breaking of a hermetic seal may be prevented.

While specific embodiments have been shown and described above, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A MEMS device comprising:
   a substrate;
   a MEMS element portion disposed on a surface of the substrate;
   a cap having a cavity formed to oppose the MEMS element portion; and
   a diffusion prevention layer formed on at least a portion of the cap,
   wherein at least one of the cap and the substrate comprises a bonding layer disposed outside of the cavity, and
   wherein the cap comprises a spreading prevention portion disposed between the bonding layer and the cavity and the spreading prevention portion comprising a V-shape in cross-section.

2. The MEMS device according to claim 1, wherein the diffusion prevention layer is formed at least within the spreading prevention portion and under the bonding layer.

3. The MEMS device according to claim 1, wherein the cap is formed of a material containing silicon, and the bonding layer is formed of a metal material.

4. The MEMS device according to claim 3, wherein the bonding layer is formed of a material containing at least one of gold (Au), tin (Sn), chromium (Cr), titanium (Ti), aluminum (Al), copper (Cu), and germanium (Ge).

5. The MEMS device according to claim 1, wherein the diffusion prevention layer is formed of an oxide film.

6. The MEMS device according to claim 1, wherein the spreading prevention portion has an inclined surface having an angle of 50° to 60° by a crystal plane (111).

7. The MEMS device according to claim 6, wherein the spreading prevention portion has an inclined surface having an angle of about 54.74° by a crystal plane (111).

8. The MEMS device according to claim 1, wherein the cavity is exposed through the diffusion prevention layer.

9. The MEMS device according to claim 1, wherein the spreading prevention portion comprises a strip shape corresponding to a shape of the cavity.

10. The MEMS device according to claim 1, wherein the cavity comprises a rectangular shape in cross-section.

11. The MEMS device according to claim 1, wherein a portion of the bonding layer is extended into the spreading prevention portion.

12. A MEMS device comprising:
    a cap comprising a cavity and a spreading prevention trench disposed outward of the cavity, wherein the spreading prevention trench comprises opposing inclined walls in cross-section;
    a diffusion prevention layer disposed on the cap and in the spreading prevention trench;
    a bonding layer disposed on the diffusion prevention layer outward of the cavity;
    a substrate disposed on the bonding layer; and
    a MEMS element portion disposed on the substrate between the substrate and the cavity.

13. The MEMS device according to claim 12, wherein the diffusion prevention layer is disposed in the cavity.

14. The MEMS device according to claim 12, wherein the bonding layer is disposed outward of the spreading prevention trench.

15. The MEMS device according to claim 14, wherein the bonding layer extends into the spreading prevention trench.

16. The MEMS device according to claim 12, wherein the spreading prevention trench comprises a V-shape in cross-section.

* * * * *